(12) United States Patent
    Oka

(10) Patent No.: US 10,580,760 B2
(45) Date of Patent: *Mar. 3, 2020

(54) LIGHT EMITTING DEVICE

(71) Applicant: NICHIA CORPORATION, Anan-shi, Tokushima (JP)

(72) Inventor: Yuta Oka, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/292,151

(22) Filed: Mar. 4, 2019

(65) Prior Publication Data

US 2019/0206847 A1    Jul. 4, 2019

Related U.S. Application Data

(63) Continuation of application No. 16/105,688, filed on Aug. 20, 2018, now Pat. No. 10,262,979, which is a
(Continued)

(30) Foreign Application Priority Data

Nov. 9, 2016   (JP) .................................. 2016-218874

(51) Int. Cl.
  *H01L 33/50*    (2010.01)
  *H01L 25/075*   (2006.01)
  (Continued)

(52) U.S. Cl.
  CPC ........ *H01L 25/0753* (2013.01); *H01L 33/502* (2013.01); *H01L 33/508* (2013.01);
  (Continued)

(58) Field of Classification Search
  CPC ... H01L 25/0753; H01L 33/50; H01L 33/504; H01L 33/60; H01L 33/52
  See application file for complete search history.

(56) References Cited

U.S. PATENT DOCUMENTS 8,633,504 B2 * 1/2014 Tsuyoshi ............. H01L 25/0753
                                                    257/98
9,842,970 B2 * 12/2017 Oka ........................ H01L 33/60
(Continued)

FOREIGN PATENT DOCUMENTS

JP    2006-310613 A    11/2006
JP    2009-218274 A     9/2009
(Continued)

OTHER PUBLICATIONS

Notice of Allowance on U.S. Appl. No. 16/105,688 dated Dec. 5, 2018.
(Continued)

*Primary Examiner* — Jaehwan Oh
(74) *Attorney, Agent, or Firm* — Foley & Lardner LLP

(57) ABSTRACT

A light emitting device includes: a first light emitting element configured to emit light of a first peak wavelength; a second light emitting element configured to emit light of a second peak wavelength that is different from the first peak wavelength; a first light reflecting member disposed in contact with at least one lateral surface of the first light emitting element, the first light reflecting member having an upper surface from which an upper surface of the first light emitting element is exposed; a wavelength conversion member covering the upper surface of the first light emitting element; and a second light reflecting member disposed on the upper surface of the first light reflecting member, the second light reflecting member being located between the second light emitting element and the wavelength conversion member in a plan view.

20 Claims, 7 Drawing Sheets

Related U.S. Application Data continuation of application No. 15/806,192, filed on Nov. 7, 2017, now Pat. No. 10,109,615.

(51) Int. Cl.
*H01L 33/54* (2010.01)
*H01L 33/60* (2010.01)
*H01L 33/62* (2010.01)

(52) U.S. Cl.
CPC .............. *H01L 33/54* (2013.01); *H01L 33/60* (2013.01); *H01L 33/62* (2013.01); *H01L 33/505* (2013.01); *H01L 2933/0091* (2013.01)

(56) References Cited

U.S. PATENT DOCUMENTS

| | | |
|---|---|---|
| 2006/0245188 A1 | 11/2006 | Takenaka |
| 2013/0240931 A1 | 9/2013 | Akimoto et al. |
| 2013/0329440 A1 | 12/2013 | Tsutsumi et al. |
| 2014/0168572 A1* | 6/2014 | Iwata .................. H01L 51/5268 349/61 |
| 2018/0033924 A1* | 2/2018 | Andrews ............. H01L 25/0753 |

FOREIGN PATENT DOCUMENTS

| | | |
|---|---|---|
| JP | 2011-096739 A | 5/2011 |
| JP | 2012-169189 A | 9/2012 |
| JP | 2013-021351 A | 1/2013 |
| JP | 2013-197309 A | 9/2013 |
| JP | 2013-197439 A | 9/2013 |

OTHER PUBLICATIONS

U.S. Notice of Allowance on U.S. Appl. No. 15/806,192 dated May 21, 2018.

* cited by examiner

LIGHT EMITTING DEVICE

CROSS-REFERENCE TO RELATED APPLICATIONS

The present application is a continuation of U.S. patent application Ser. No. 16/105,688, filed on Aug. 20, 2018, which is a continuation of U.S. patent application Ser. No. 15/806,192, filed on Nov. 7, 2017, which claims priority to Japanese Patent Application No. 2016-218874, filed on Nov. 9, 2016, the disclosures of which are hereby incorporated by reference in their entireties.

BACKGROUND

The present disclosure relates to a light emitting device.

Light emitting devices for lighting purposes are sometimes required to achieve high luminance and high color rendering properties. Color rendering properties of the light emitting devices can be improved by, for example, using a plurality of light emitting elements having different emission wavelengths. For example, Japanese Patent Publication No. 2006-310613 discloses a light emitting device which includes light emitting elements which are capable of emitting white light, red light, green light and blue light.

SUMMARY

Light emitting devices have been required to achieve higher luminance and higher color rendering properties than conventional light emitting devices. An exemplary embodiment of the present disclosure provides a light emitting device with high luminance and high color rendering properties.

A light emitting device according to one embodiment includes: at least one first light emitting element configured to emit light of a first peak wavelength; at least one second light emitting element configured to emit light of a second peak wavelength that is different from the first peak wavelength; a first light reflecting member disposed in contact with at least one lateral surface of the first light emitting element, the first light reflecting member having an upper surface from which an upper surface of the at least one first light emitting element is exposed, the upper surface of the first light reflecting member being substantially coplanar with the upper surface of the at least one first light emitting element; a wavelength conversion member covering the upper surface of the at least one first light emitting element, the wavelength conversion member being configured to convert light of the first peak wavelength into light of a third peak wavelength that is different from the first peak wavelength and the second peak wavelength; and a second light reflecting member disposed on the upper surface of the first light reflecting member, the second light reflecting member being located between the at least one second light emitting element and the wavelength conversion member in a plan view. An upper surface of the second light reflecting member is at a position higher than an upper surface of the at least one second light emitting element.

According to the present disclosure, a light emitting device with high luminance and high color rendering properties can be provided.

DETAILED DESCRIPTION

Figure 1:
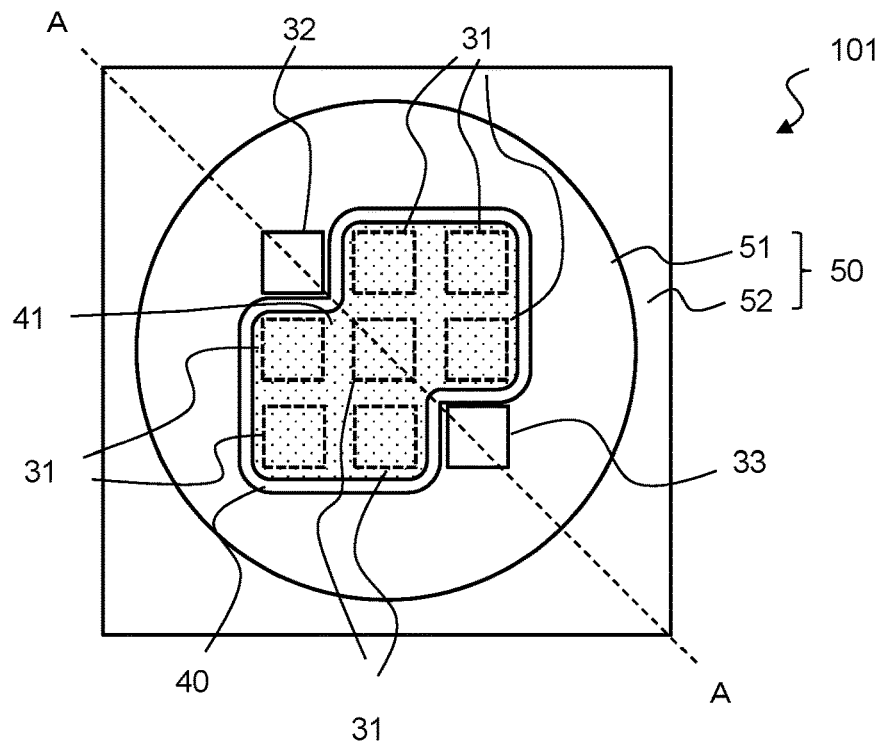
FIG. 1 is a plan view showing a light emitting device according to one of embodiments of the present disclosure.

Hereinafter, embodiments of a light emitting device of the present disclosure are described in detail with reference to the drawings. The following embodiments are merely exemplary. The light emitting device of the present disclosure is not limited to the following embodiments. In the following description, terms that designate directions or positions (e.g., "upper", "lower", and other terms including such terms) are used. Such terms are used merely for clear understanding of relative directions or positions in the referenced drawings. So long as the relationship of relative directions or positions designated by terms such as "upper", "lower", etc., in the referred drawings is identical, drawings other than those provided in the present disclosure or actual products may not have the same arrangement as that shown in the referred drawings. The size or positional relationship of components shown in the drawings is sometimes exaggerated for clear understanding. The sizes of components in an actual light emitting device, or the relative sizes of the components in the actual light emitting device, are sometimes not reflected in the drawings. In the present disclosure, the term "substantially coplanar" includes a case in which surfaces are in the range of about ±50 μm from being coplanar, unless specified otherwise.

Figure 2:
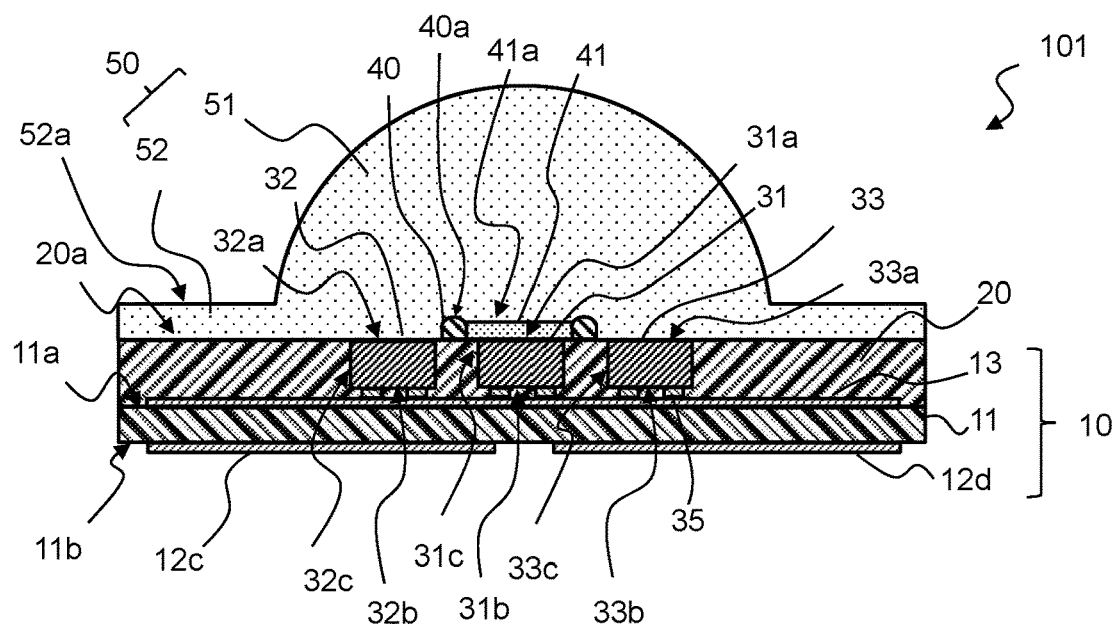
FIG. 2 is a cross-sectional view of the light emitting device taken along line A-A of FIG. 1.
Figure 3:
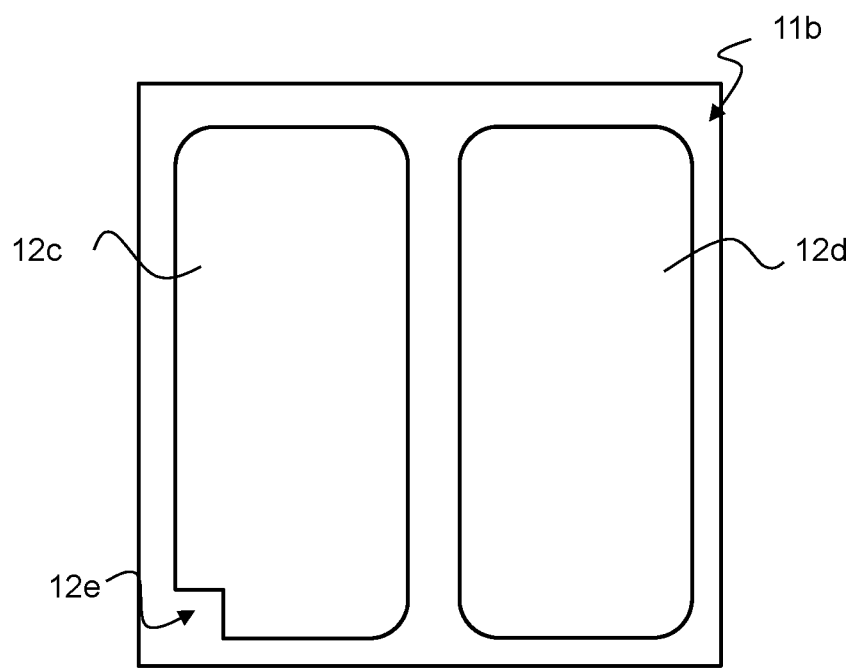
FIG. 3 is a drawing viewed form below the light emitting device shown in FIG. 1.

FIG. 1 is a plan view showing one embodiment of a light emitting device 101 according to the present disclosure. FIG. 2 is a cross-sectional view of the light emitting device 101 taken along line A-A of FIG. 1. FIG. 3 is a drawing viewed form below the light emitting device 101.

The light emitting device 101 includes at least two types of light emitting elements of different emission wavelengths, a first light reflecting member 20, a second light reflecting member 40, and a wavelength conversion member 41. In the present embodiment, the light emitting device 101 includes first light emitting elements 31 and a second light emitting element 32 whose emission wavelength is different from that of the first light emitting elements 31. The light emitting device 101 may further include a third light emitting element 33 whose emission wavelength is different from those of the first light emitting elements 31 and the second light emitting element 32. The light emitting device 101 may further include a wiring board (i.e., base) 10 supporting the first light emitting elements 31 and the second light emitting element 32, and a cover member 50 covering the first light emitting elements 31, the second light emitting element 32 and the wavelength conversion member 41. Hereinafter, these components will be described in detail.

Wiring Board 10

The wiring board 10 is a component on which the first light emitting elements 31 and the second light emitting element 32 are mounted and which electrically connects the first light emitting elements 31 and the second light emitting element 32 with external circuits outside the light emitting device 101. When the light emitting device 101 includes the third light emitting element 33, the wiring board 10 is a component on which the third light emitting element 33 is also mounted and which also electrically connects the third light emitting element 33 with external circuits outside the light emitting device 101. The wiring board 10 includes, for example, a base 11, a wiring conductor 13 provided on the upper surface 11a of the base 11, and terminal electrodes 12c, 12d provided on the lower surface 11b.

The base 11 is formed with, for example, an insulative material, such as glass epoxy, resin, ceramic (e.g., HTCC, LTCC), etc., or a composite material that includes an insulative material and a metal member. The base 11 is preferably formed with a ceramic material or thermosetting resin which has high heat resistance and high weather resistance. Examples of the ceramic material include alumina, aluminum nitride, and mullite. Aluminum nitride is particularly preferred due to its good heat dissipation property. The base may be formed with a material provided by, for example, combining an insulative material, such as BT resin, glass epoxy, epoxy resin, with such ceramic materials. Examples of the thermosetting resin include epoxy resins, triazine derivative epoxy resins, denatured epoxy resins, silicone resins, denatured silicone resins, acrylate resins, and urethane resins. Among these examples, using a triazine derivative epoxy resin is preferred. The base 11 preferably has a plate-like shape which has a flat surface.

The wiring conductor 13 is provided on the upper surface 11a of the base 11 and is electrically connected with the terminals of the first light emitting elements 31, the second light emitting element 32 and the third light emitting element 33. As will be described later, the light emitting device 101 includes one or a plurality of first light emitting elements 31 and one or a plurality of second light emitting elements 32, therefore, the wiring conductor 13 forms a circuit pattern that connects the first light emitting elements 31 and the second light emitting element 32. The wiring conductor 13 can be made of a metal such as copper, aluminum, gold, silver, tungsten, iron, or nickel, or an alloy such as an iron-nickel alloy or phosphor bronze. The thickness of the wiring conductor 13 is, for example, from 5 μm to 500 μm.

On the lower surface 11b of the base 11, at least one pair of terminal electrodes 12c, 12d are provided as shown in FIG. 3. The terminal electrodes 12c, 12d are electrically connected with the wiring conductor 13 by a via conductor provided in the base 11. One of the terminal electrodes 12c, 12d is a cathode, and the other is an anode. The terminal electrodes 12c, 12d are connected with an external driving circuit or the like. To make the polarity distinguishable, one of the terminal electrodes 12c, 12d may have an anode or cathode mark in the form of a depression or the like. For example, the terminal electrode 12c may have a depression 12e. The terminal electrodes 12c, 12d can also be formed with, for example, the same material as that of the wiring conductor 13.

First Light Emitting Element 31, Second Light Emitting Element 32, Third Light Emitting Element 33

The first light emitting element 31, the second light emitting element 32 and the third light emitting element 33 are, for example, a semiconductor light emitting element, such as a light-emitting diode chip. The semiconductor light emitting element includes a light transmitting substrate, a semiconductor multilayer structure, and electrodes. The light transmitting substrate can be formed with, for example, a light-transmitting, insulative material, such as sapphire ($Al_2O_3$), or a semiconductor material which is capable of transmitting light from the semiconductor multilayer structure therethrough (e.g., a nitride based semiconductor material).

The semiconductor multilayer structure includes, for example, a plurality of semiconductor layers, including a n-type semiconductor layer, an emission layer (i.e., active layer) and a p-type semiconductor layer. The semiconductor layers can be formed with, for example, a semiconductor material such as a Group III-V compound semiconductor or a Group II-VI compound semiconductor. Specifically, a nitride based semiconductor material such as $In_xAl_yGa_{1-x}$—N ($0 \le x$, $0 \le y$, $x+y \le 1$), a gallium arsenide based semiconductor material, or an indium phosphate based semiconductor material can be used.

The shape of the electrodes can be selected from various shapes including substantially rectangular shapes and circular shapes. The material of the electrodes can be a known material so long as it is electrically conductive.

The thicknesses in vertical direction of the first light emitting element 31, the second light emitting element 32 and the third light emitting element 33 include the light transmitting substrate, the semiconductor multilayer structure and the electrodes. The dimension of each of the each light emitting elements is, for example, preferably not more than 500 μm, more preferably not more than 400 μm, or not more than 300 μm, and not less than 100 μm. The shape in a plan view of each of the first light emitting element 31, the second light emitting element 32 and the third light emitting element 33 is preferably a quadrangular shape or a shape approximate to the quadrangular shape. When the light emitting elements each have a substantially quadrangular shape, each of the dimensions thereof is preferably not more than 5 mm×5 mm, more preferably not less than 200 μm×200 μm, for example. When the shape in a plan view of a light emitting element is a substantially quadrangular, the size of the light emitting element can be defined as one vertical side of the light emitting element by one lateral side of the light emitting element.

The first light emitting element 31, the second light emitting element 32 and the third light emitting element 33 emit light of different wavelengths. Specifically, the first light emitting element 31, the second light emitting element 32 and the third light emitting element 33 respectively emit light of the first peak wavelength, light of the second peak wavelength and light of the fourth peak wavelength. The peak wavelength refers to a value of wavelength at which the emission intensity is the maximum in the light emitted from the light emitting element. In the present embodiment, the first peak wavelength is shorter than the second peak wavelength and the fourth peak wavelength. For example, the first light emitting element 31 emits blue light, the second light emitting element 32 emits green or red light, and the third light emitting element 33 emits red or green light. The wavelengths of light emitted from the first light emitting element 31, the second light emitting element 32 and the third light emitting element 33 can be varied by, for example, controlling the composition ratio of the semiconductor material that forms the emission layer of the semiconductor multilayer structure or by using different semiconductor materials. The light emitting device includes the second light emitting element 32 whose peak wavelength is different from that of the first light emitting element 31, thus, the color rendering properties of the light emitting device improves. The light emitting device further includes the third light emitting element 33 whose peak wavelength is different from those of the first light emitting element 31 and the second light emitting element 32, therefore, the color rendering properties of the light emitting device further improves.

As shown in FIG. 1, the light emitting device 101 of the present embodiment includes seven first light emitting elements 31, one second light emitting element 32 and one third light emitting element 33. The number of first light emitting elements 31 is preferably greater than the number of second light emitting elements 32 and than the number of third light emitting elements 33. The upper surface of the first light emitting elements 31 is covered with the wavelength conversion member, and therefore, part of light of the first peak wavelength from the first light emitting elements 31 is converted into light of a different wavelength. Thus, there is a probability that the luminance of the light of the first peak wavelength decreases. When the number of first light emitting elements 31 is greater than the number of second light emitting elements 32 and than the number of third light emitting elements 33, the luminance of the light of the first peak wavelength can be increased, and therefore, the color rendering properties of the light emitting device improves.

The first light emitting elements 31, the second light emitting element 32 and the third light emitting element 33 each have the upper surfaces 31a, 32a, 33a and the lower surfaces 31b, 32b, 33b, and each emit light of the above-described wavelengths from the upper surfaces 31a, 32a, 33a. The lower surfaces 31b, 32b, 33b face the wiring board 10 and have terminals for power supply. As shown in FIG. 2, the first light emitting elements 31, the second light emitting element 32 and the third light emitting element 33 are placed on, and electrically connected with, the wiring conductor 13 of the wiring board 10. For example, the terminals of the first light emitting elements 31, the second light emitting element 32 and the third light emitting element 33 are electrically connected with the wiring conductor 13 via metal bumps 35. Other bonding materials, such as electrically-conductive pastes, anisotropic electrically-conductive pastes, solders, etc., may be used.

The upper surfaces 31a, 32a, 33a of the first light emitting elements 31, the second light emitting element 32 and the third light emitting element 33 each have, for example, a rectangular shape. The first light emitting elements 31, the second light emitting element 32 and the third light emitting element 33 each further include four lateral surfaces 31c, 32c, 33c. The upper surfaces 31a, 32a, 33a, the lower surfaces 31b, 32b, 33b, and the lateral surfaces 31c, 32c, 33c, of the first light emitting elements 31, the second light emitting element 32 and the third light emitting element 33 may be provided with an inorganic protecting film formed with silicon oxide, silicon nitride, or the like.

Figure 4:
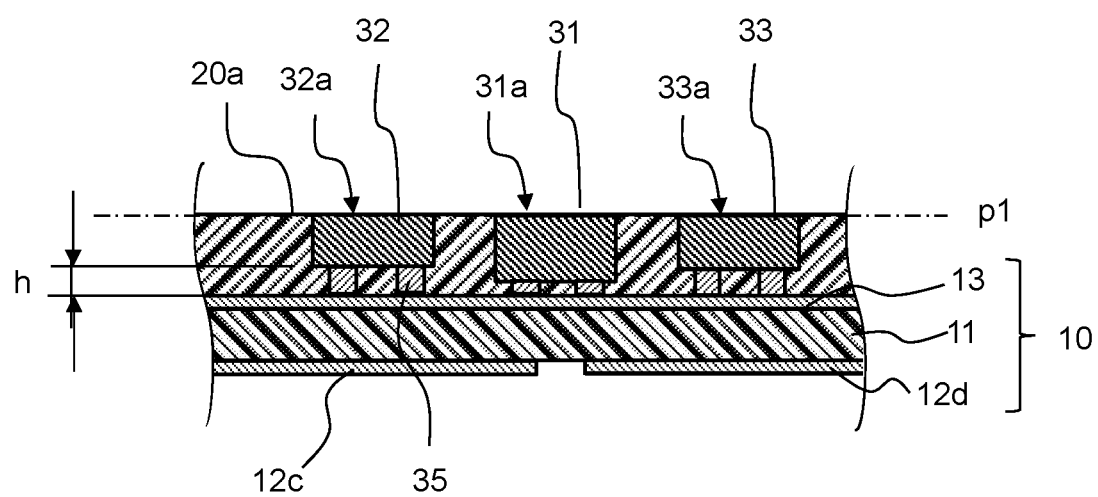
FIG. 4 is a cross-sectional view showing an example of connection between respective light emitting elements and a wiring board in the light emitting device shown in FIG. 1.

The first light emitting elements 31, the second light emitting element 32 and the third light emitting element 33 are supported by the wiring board 10 such that the upper surfaces 31a, 32a, 33a are substantially coplanar. The first light emitting elements 31, the second light emitting element 32 and the third light emitting element 33 may have different heights due to, for example, the difference in the semiconductor multilayer structures, which is attributed to the difference in wavelength of emitted light. The height is defined as the interval between the upper surface 31a, 32a, 33a and the lower surface 31b, 32b, 33b. In this case, as shown in FIG. 4, it is preferred that the height of the metal bumps 35 that connect the first light emitting elements 31, the second light emitting element 32 and the third light emitting element 33 with the wiring conductor 13 are adjusted such that the upper surfaces 31a, 32a, 33a of the light emitting elements are substantially coplanar (p1).

Figure 5:
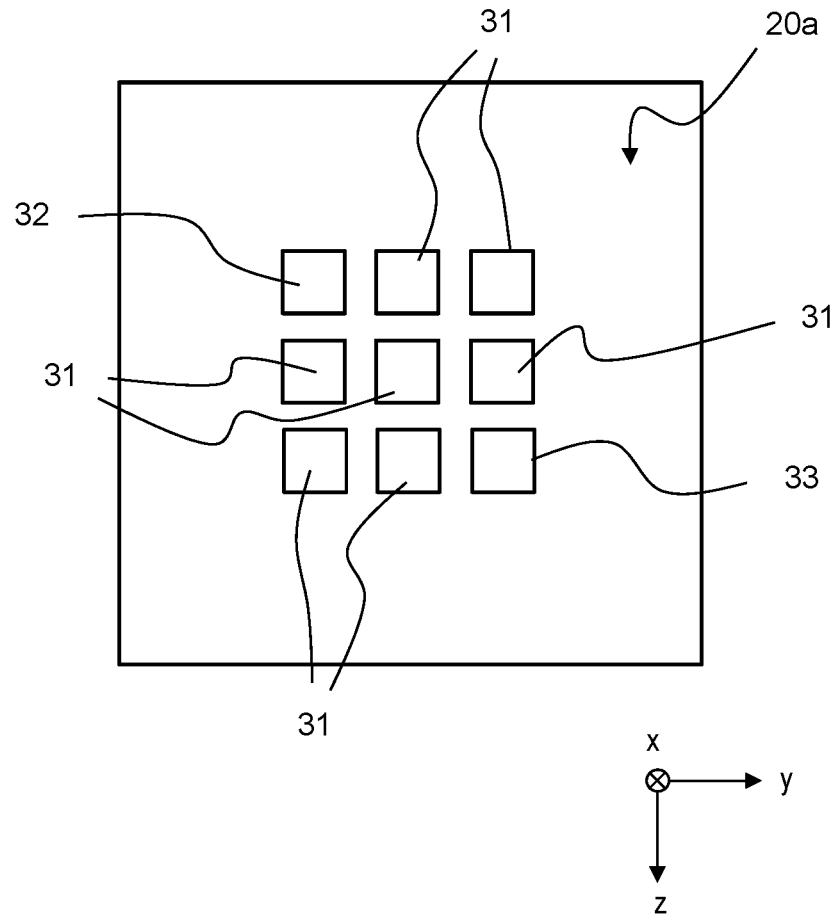
FIG. 5 is a plan view showing an example of arrangement of the light emitting elements in the light emitting device shown in FIG. 1.

The first light emitting elements 31, the second light emitting element 32 and the third light emitting element 33 are arranged on the wiring board 10. FIG. 5 is a diagram showing an example of arrangement of the first light emitting elements 31, the second light emitting element 32 and the third light emitting element 33. In the example shown in FIG. 1, the first light emitting elements 31, the second light emitting element 32 and the third light emitting element 33 are arranged in a matrix of 3 rows and 3 columns in the x and y directions. As will be described later, a wavelength conversion member is placed over the first light emitting elements 31. Therefore, it is preferred that the first light emitting elements 31 are arranged together in a group. Specifically, it is preferred that each of the seven first light emitting elements 31 are positioned beside another one of the first light emitting elements 31 in at least one of the x direction and the y direction. With this arrangement, light emitted from the first light emitting elements 31 can be gathered in one region, so that the wavelength conversion member is provided only in one region. The arrangement of the first light emitting elements 31, the second light emitting element 32 and the third light emitting element 33 can, however, be appropriately employed from arrangements other than that shown in FIG. 5. For example, the first light emitting elements 31, the second light emitting element 32 and the third light emitting element 33 may be arranged concentrically or randomly.

The space between the first light emitting elements 31, the second light emitting element 32 and the third light emitting element 33 can be appropriately selected, but is preferably shorter than the length of one side of each light emitting element, for example. For example, it is preferably in a range of from 1 μm to 200 μm, more preferably from 50 μm to 100 μm. Accordingly, as will be described later, the space between the light emitting elements is reduced while the area for the second light reflecting member to be disposed is ensured, whereby part of the wavelength conversion member that the light from the first light emitting elements is unlikely to directly enter can be reduced as much as possible. Such an arrangement makes it possible to inhibit or prevent the luminance non-uniformity across the wavelength conversion member.

First Light Reflecting Member 20

The first light reflecting member 20 inhibits or prevents light emitted from the first light emitting elements 31 from being absorbed by the second light emitting element 32 and/or the third light emitting element 33. The first light reflecting member 20 is disposed on the wiring board 10 in contact with at least the lateral surfaces 31c of the first light emitting elements 31. With the first light reflecting member 20, light emitted from the lateral surfaces of the first light emitting elements 31 is blocked by the first light reflecting member 20, and therefore inhibited or prevented from being absorbed by the second light emitting element 32 and/or the third light emitting element 33, so that decrease of the luminance of the light emitting device can be mitigated. The first light reflecting member 20 is in contact with the lateral surfaces 31c of the first light emitting elements 31; thus, the light emitted from the lateral surfaces of the first light emitting elements 31 is likely to be blocked by the first light reflecting member 20 as compared with a case where the first light reflecting member 20 is not in contact with the lateral surfaces 31c of the first light emitting elements 31. The first light reflecting member 20 has an upper surface 20a at which the upper surfaces 31a of the first light emitting elements 31 are exposed. The upper surface 20a of the first light reflecting member 20 is substantially coplanar with the upper surfaces 31a of the first light emitting elements 31, in cross section. In the present embodiment, the first light reflecting member 20 covers the lateral surfaces 32c, 33c of the second light emitting element 32 and the third light emitting element 33 on the wiring board 10, and the upper surface 20a is substantially coplanar with the upper surfaces 32a, 33a of the second light emitting element 32 and the third light emitting element 33. In other words, the first light emitting elements 31, the second light emitting element 32 and the third light emitting element 33 are embedded in the first light reflecting member 20 such that the first light reflecting member 20 covers the entirety of the lateral surfaces 31c, 32c, 33c while the upper surfaces 31a, 32a, 33a of the first light emitting elements 31, the second light emitting element 32 and the third light emitting element 33 are exposed. Such a configuration makes it possible to inhibit or prevent light of the second light emitting element from 32 being absorbed by the first light emitting elements 31 and/or the third light emitting element 33. Also, such a configuration makes it possible to inhibit or prevent light of the third light emitting element 33 from being absorbed by the first light emitting elements 31 and/or the second light emitting element 22.

The upper surface 20a of the first light reflecting member 20 may be planar (i.e., flat) or may not be planar. When the upper surface 20a of the first light reflecting member 20 is not planar, the upper surface 20a may partly have recesses which are formed in curing a resin material during the process of producing the first light reflecting member 20 due to the weight of the resin material itself or sink or contraction of the resin material.

The first light reflecting member 20 is an insulator, and can be formed with a reflective resin which has a certain strength. The reflective resin has a high reflectance, e.g., 70% or more, for the light from the light emitting elements.

A possible example of the reflective resin is a light-transmitting resin in which a reflective substance is dispersed. Suitable examples of the reflective substance include titanium oxide, silicon dioxide, zirconium dioxide, potassium titanate, aluminum oxide, aluminum nitride, boron nitride, and mullite. The reflective substance can be in the form of particles, fiber, or flakes. A reflective substance fiber is particularly preferred because it can decrease the thermal expansion coefficient of the light reflecting member, so that, for example, the difference of the thermal expansion coefficient from that of the light emitting element can be reduced. As the resin material contained in the reflective resin, a thermosetting, light-transmitting resin, such as silicone resins, modified silicone resins, epoxy resins, and phenolic resins, is preferred.

The first light emitting elements 31 and the second light emitting element 32 may be supported by the first light reflecting member 20. In this case, the light emitting device does not need to include a wiring board. When the light emitting device does not include the wiring board 10, the electrodes of the first light emitting element and the second light emitting element are electrically connected with external circuits.

Wavelength Conversion Member 41

The wavelength conversion member 41 converts light of the first peak wavelength emitted from the first light emitting elements 31 into light whose wavelength is different from the first peak wavelength. The wavelength conversion member 41 covers the upper surfaces 31a of the first light emitting elements 31. In the present embodiment, the light emitting device 101 includes a plurality of first light emitting elements 31, and therefore, the wavelength conversion member 41 also lies over the upper surface 20a of the first light reflecting member 20 interposed between the plurality of first light emitting elements 31. To securely cover the entirety of the upper surfaces 31a of the first light emitting elements 31, the wavelength conversion member 41 is arranged in such a manner as to also cover part of the upper surface 20a of the first light reflecting member 20 lying outside the perimeter which defines the upper surfaces 31a of the first light emitting elements 31 in a plan view (in a top view). The position of the wavelength conversion member 41 is defined by a region surrounded by the second light reflecting member 40 that will be described later. The wavelength conversion member 41 does not cover the upper surfaces 32a, 33a of the second light emitting element 32 and the third light emitting element 33.

Figure 6A:
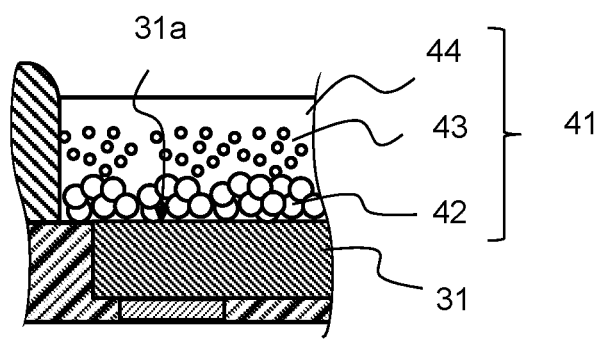
FIG. 6A is a cross-sectional view showing the configuration of a wavelength conversion member in the light emitting device shown in FIG. 1.

As shown in FIG. 6A, the wavelength conversion member 41 contains a phosphor 42 which absorbs part of light emitted from the first light emitting elements 31 and emits fluorescent light (or phosphorescent light; hereinafter simply referred to as "light"). The phosphor 42 emits light of the third peak wavelength that is different from the first peak wavelength and the second peak wavelength. In other words, the wavelength conversion member 41 converts part of the light of the first peak wavelength into light of the third peak wavelength. When the first peak wavelength is blue, for example, the wavelength conversion member 41 absorbs part of blue light emitted from the first light emitting elements 31 and re-emits yellow light. The combination of the light of the first peak wavelength and the light of the third peak wavelength preferably produces white light when mixed together. The light of the third peak wavelength converted by the wavelength conversion member 41 exhibits a broad spectrum as compared with the spectrum of light emitted from the light emitting element. Therefore, the color rendering properties of the light emitting device improves as compared with a case where a light emitting element which emits the light of the third peak wavelength is used. When the light emitting device 101 includes the second light emitting element 32 and the third light emitting element 33 that emit light of wavelengths different from the first peak wavelength of the first light emitting element and the third peak wavelength converted by the wavelength conversion member, further improvement can be realized in the color rendering properties of the light emitting device.

In a region of the wavelength conversion member 41 into which the light from the first light emitting elements 31 does not enter, or a region of the wavelength conversion member 41 into which a small amount of light from the first light emitting elements 31 enters, the balance between the yellow light produced by wavelength conversion and the light emitted from the first light emitting elements 31 and transmitted through the wavelength conversion member 41 breaks down, and therefore, light emitted from that region sometimes appears to be emitted with a color deviated from white light or has decreased luminance. Accordingly, the ratio of the area of part in a plan view overlaps the upper surfaces 31a of the first light emitting elements 31 to the area surrounded by the second light reflecting member 40, in other words, the area in which the wavelength conversion member 41 is provided is preferably large, for example preferably not less than 70%, more preferably, not less than 80%.

The phosphor 42 of the wavelength conversion member 41 may be made of, for example, the following materials:

(i) Garnet based phosphors, such as aluminum garnet phosphors (e.g., yttrium aluminum garnet (YAG) based phosphors activated with cerium, lutetium aluminum garnet (LAG) based phosphors activated with cerium, etc.);

(ii) Nitrogen-containing calcium aluminosilicate (CaO—$Al_2O_3$—$SiO_2$) based phosphors activated with europium and/or chromium;

(iii) Silicate based ($(Sr,Ba)_2SiO_4$) phosphors activated with europium;

(iv) β-SiAlON based phosphors;

(v) Nitride based phosphors, such as CASN ($CaAlSiN_3$:Eu) based phosphors or SCASN based phosphors, etc.;

(vi) Rare earth nitride based phosphors, such as $LnSi_3N_{11}$ based phosphors, LnSiAlON based phosphors (Ln is a rare earth element), etc.;

(vii) Oxynitride based phosphors, such as $BaSi_2O_2N_2$:Eu based phosphors, $Ba_3Si_6O_{12}N_2$:Eu based phosphors, etc.;

(viii) Fluoride complex phosphors activated with manganese (e.g., KSF based ($K_2SiF_6$:Mn) phosphors);

(ix) Sulfide based phosphors, such as CaS based (CaS:Eu) phosphors, $SrGa_2S_4$ based ($SrGa_2S_4$:Eu) phosphors, $SrAl_2O_4$ based phosphors, ZnS based phosphors, etc.; and (x) Chlorosilicate based phosphors.

Alternatively, the phosphor 42 may be a semiconductor material, for example, a Group II-VI, Group III-V, or Group IV-VI semiconductor, specifically nano-sized highly-dispersive particles (so-called "nanocrystal") such as CdSe, core shell type $CdS_xSe_{1-x}$/ZnS and GaP, or a light-emitting substance called quantum dots (i.e., Q-Dots). The quantum dot phosphors are unstable and, therefore, the particle surface may be covered or stabilized with polymethyl methacrylate (PMMA), a silicone resin, an epoxy resin, or a hybrid resin thereof.

The wavelength conversion member 41 may further contain a light diffuser 43. As the light diffuser 43, specifically, an oxide such as $SiO_2$, $Al_2O_3$, $Al(OH)_3$, $MgCO_3$, $TiO_2$, $ZrO_2$, ZnO, $Nb_2O_5$, MgO, $Mg(OH)_2$, SrO, $In_2O_3$, $TaO_2$, HfO, SeO, $Y_2O_3$, CaO, $Na_2O$, or $B_2O_3$, a nitride such as SiN, AlN, or AlON, or a fluoride such as $MgF_2$ can be used. These may be used solely or may be used together in the form of a mixture.

Alternatively, an organic filler may be used as the light diffuser 43. For example, particles of various resins can be in the granular form. In this case, examples of the various resins include silicone resins, polycarbonate resins, polyethersulfone resins, polyarylate resins, polytetrafluoroethylene resins, epoxy resins, cyanate resins, phenolic resins, acrylic resins, polyimide resins, polystyrene resins, polypropylene resins, polyvinyl acetal resins, polymethyl methacrylate resins, urethane resins, and polyester resins.

It is preferred that the light diffuser 43 is a material that does not substantially convert the wavelength of light emitted from the first light emitting elements 31. The amount of the contained light diffuser 43 is determined such that light can be diffused, and may be, for example, not less than about 0.01 wt % and not more than about 30 wt %, preferably not less than about 2 wt % and not more than about 20 wt %. The size of the light diffuser 43 is also determined such that light can be diffused, and may be, for example, not less than about 0.01 μm and not more than about 30 μm, preferably not less than about 0.5 μm and not more than about 10 μm. The shape of the particles of the light diffuser 43 may respectively be spherical or a scale-like shape. Preferably, the shape of the light diffuser 43 is spherical in order that light can be diffused uniformly.

The wavelength conversion member 41 includes a light-transmitting resin 44, such as a silicone resin, an epoxy resin, or a urea resin. In the light-transmitting resin 44, the phosphor 42 may be dispersed. With the second light reflecting member 40 (described later) serving as a dam, the wavelength conversion member 41 can be placed in a region surrounded by the second light reflecting member 40. Therefore, the light-transmitting resin 44 in not yet cured state can be a liquid resin material which has relatively low viscosity (for example, the viscosity at 25° C. is 0.01 to 5.0 Pa·s). Thus, even if the region in which the wavelength conversion member 41 is to be formed is small, the wavelength conversion member 41 can be accurately placed in a predetermined region.

When the light-transmitting resin 44 in not yet cured state has the above-described characteristic, the phosphor that has a relatively large relative density is likely to precipitate in the uncured resin material. This characteristic can be utilized to localize the phosphor 42 in the wavelength conversion member 41 or to selectively arrange the light diffuser 43 and the phosphor 42. For example, as shown in FIG. 6A, the wavelength conversion member 41 includes the phosphor 42, the light diffuser 43 and the light-transmitting resin 44. In the light-transmitting resin 44, the phosphor 42 is located on the upper surface 31a side of the first light emitting element 31, while the light diffuser 43 is present on or above the phosphor 42. The wavelength conversion member 41 that has such a configuration can be realized by mixing the phosphor 42 and the light diffuser 43 into an uncured resin material which has small viscosity, and potting the uncured resin material onto the upper surfaces 31a of the first light emitting elements 31. During curing of the resin material, the phosphor 42 that has relatively large relative density precipitate, while the light diffuser 43 that has relatively small relative density resides on or above the phosphor 42.

The phosphor 42 absorbs light, and radiates heat when it emits light of a different wavelength. Thus, the phosphor 42 is located near the first light emitting elements 31 and the wiring board 10 such that heat produced by the phosphor 42 can be efficiently transferred to the wiring board 10 and dissipated from the wiring board 10. When the phosphor used is vulnerable to water, the phosphor is localized on the upper surface side of the first light emitting elements such that the light-transmitting resin functions as a protection layer. This arrangement enables to mitigate deterioration of the phosphor and maintain good chromaticity. For example, examples of the phosphor vulnerable to water are KSF based phosphors. By selectively arranging the light diffuser 43 on the upper surface (i.e., emission surface) 41*a* side of the wavelength conversion member 41, light emitted from the wavelength conversion member 41 can be diffused, so that dark portions between the light emitting elements can be made inconspicuous. Thus, although the light emitting device 101 includes a plurality of first light emitting elements covered with the wavelength conversion member 41, the distribution of emitted light can be made uniform so that the light emitting device 101 appears to be a point light source, thereby enabling improvement of the quality of the light.

Second Light Reflecting Member 40

The second light reflecting member 40 inhibits or prevents light emitted from the second light emitting element 32 from entering the wavelength conversion member 41. By inhibiting or preventing the light emitted from the second light emitting element 32 from entering the wavelength conversion member 41, the light emitted from the second light emitting element 32 is inhibited or prevented from being absorbed by the wavelength conversion member 41. Accordingly, the luminance of the light emitting device can be improved. The second light reflecting member 40 is provided on the upper surface 20*a* of the first light reflecting member 20 and is located between the second light emitting element 32 and the wavelength conversion member 41 in a plan view. the light emitting device 101 according to the present embodiment also includes the third light emitting element 33, therefore, the second light reflecting member 40 is also located between the third light emitting element 33 and the wavelength conversion member 41 in a plan view. Such an arrangement enables the second light reflecting member 40 to inhibit or prevent light emitted from the third light emitting element 33 from entering the wavelength conversion member 41. Preferably, the second light reflecting member 40 is in contact with the lateral surfaces of the wavelength conversion member 41 and surrounds the entirety of the lateral surfaces thereof such that light from the light emitting elements other than the first light emitting elements 31 would not enter the wavelength conversion member 41. The second light reflecting member 40 functions as a reflector for inhibiting or preventing light of the first light emitting elements 31 from outgoing from the lateral surfaces of the wavelength conversion member 41 such that the light emission efficiency of the light emitting device 101 improves. Also, the second light reflecting member 40 demarcates the region of the wavelength conversion member 41.

Figure 6B:
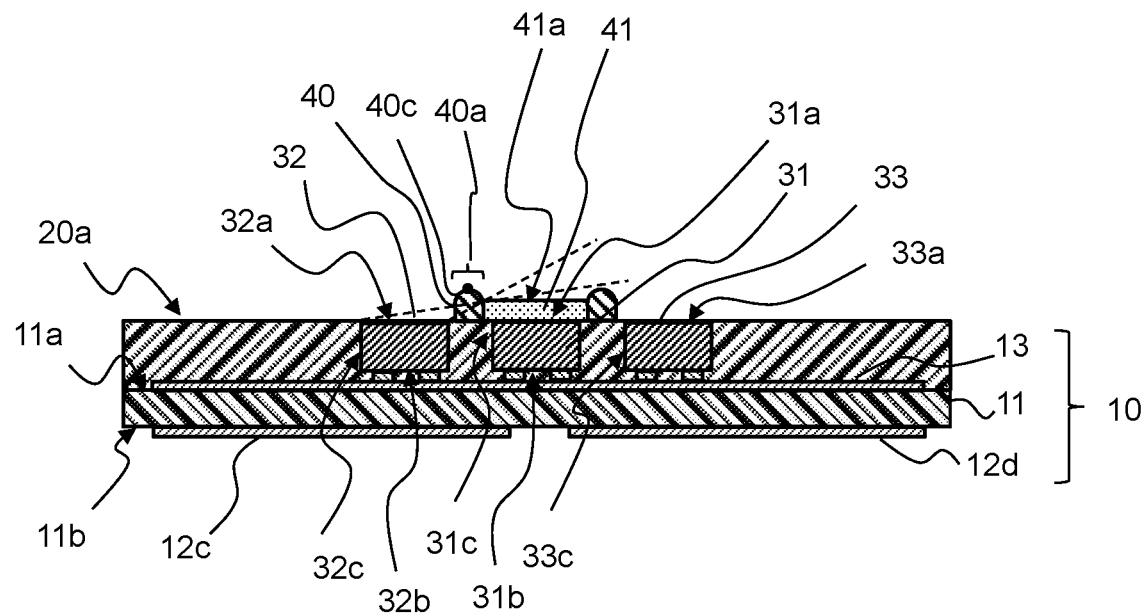
FIG. 6B is a cross-sectional view showing the relative heights of the wavelength conversion member and the second light reflecting member.

As shown in FIG. 6B, the second light reflecting member 40 preferably has a convex shape with a rounded apex in a cross sectional view. This shape can facilitate part of the light emitted from the first light emitting element, the second light emitting element and/or the third light emitting element, which is reflected by the second light reflecting member, to travel upward from the light emitting device, as compared with a case where the cross section of the second light reflecting member has a substantially quadrangular shape. Thus, the light emitted from the first light emitting element, the second light emitting element and/or the third light emitting element is more readily extracted out of the light emitting device, and therefore, the light extraction efficiency of the light emitting device can be improved.

As shown in FIG. 6B, the upper surface 40*a* of the second light reflecting member 40 is at a position higher than the upper surface 32*a* of the second light emitting element 32. When the upper surface 40*a* of the second light reflecting member 40 is a curved surface, the position of the upper surface 40*a* refers to the position of the highest point 40*c* relative to the upper surface 20*a* of the first light reflecting member 20. With this arrangement, part of the light emitted from the second light emitting element 32 is blocked by the second light reflecting member 40 and is inhibited or prevented from entering the wavelength conversion member 41. In the present embodiment, the light emitting device 101 includes the third light emitting element 33, thus, the upper surface 40*a* of the second light reflecting member 40 is at a higher position than the upper surface 33*a* of the third light emitting element 33. This arrangement allows part of the light emitted from the third light emitting element 33 to be blocked by the second light reflecting member 40 and to be inhibited or prevented from entering the wavelength conversion member 41.

It is preferred that the first light reflecting member 20 and/or the second light reflecting member 40 is located on a straight line extending between a given point on a light extraction surface of the second light emitting element 32 and a given point on the wavelength conversion member 41. This arrangement enables the light emitted from the second light emitting element 32 is blocked by at least one of the first light reflecting member 20 and the second light reflecting member 40 in such a manner as to be inhibited or prevented from entering the wavelength conversion member 41.

In the present embodiment, the lateral surfaces 32*c* of the second light emitting element 32 are covered with the first light reflecting member 20. Thus, the first light reflecting member 20 is located on a straight line extending between a given point on the lateral surfaces 32*c* of the second light emitting element 32 and a given point on the wavelength conversion member 41, so that light leakage from the lateral surfaces 32*c* is less likely to occur by at least the first light reflecting member 20.

As represented by broken lines in FIG. 6B, the second light reflecting member 40 is located on the straight line extending between a given point on the upper surface 32*a* of the second light emitting element 32 and a given point on the wavelength conversion member 41. Thus, the second light reflecting member 40 can inhibit or prevent the light emitted from the upper surface 32 from entering the wavelength conversion member 41.

In the present embodiment, the light emitting device 101 includes the third light emitting element 33; thus, it is preferred that the first light reflecting member 20 and/or the second light reflecting member 40 is located on the straight line extending between a given point on a light extraction surface of the third light emitting element 33 and a given point on the wavelength conversion member 41. With this arrangement, light emitted from the third light emitting element 33 is blocked by at least one of the first light reflecting member 20 and the second light reflecting member 40 and is inhibited or prevented from entering the wavelength conversion member 41.

As shown in FIG. 6B, when the upper surface 40*a* of the second light reflecting member 40 is at a position higher than the height (or thickness) of the upper surface 41*a* of the wavelength conversion member 41, the second light reflecting member 40 is located on the straight line extending between a given point on the upper surface 32*a* of the second light emitting element 32 and a given point on the wavelength conversion member 41 and on a straight line extending between a given point on the upper surface 33*a* of the third light emitting element 33 and a given point on the wavelength conversion member 41 regardless of the positions of the second light emitting element 32 and the third light emitting element 33 relative to the wavelength conversion member 41. Thus the second light reflecting member 40 can inhibit or prevent light emitted from the upper surface 32a of the second light emitting element 32 and light emitted from the upper surface 33a of the third light emitting element 33 from entering the wavelength conversion member 41. This feature enables to securely inhibit or prevent light of the second light emitting element 32 and light of the third light emitting element 33 from entering the wavelength conversion member 41. The width of the second light reflecting member 40 in a plan view is preferably smaller than the distance between the light emitting elements.

Figure 6C:
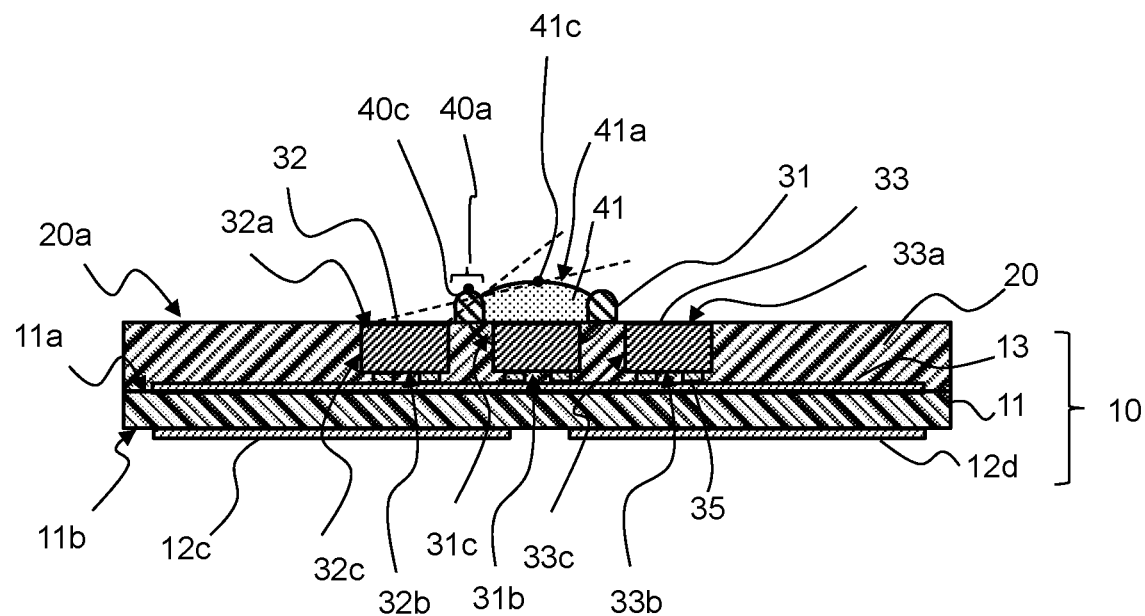
FIG. 6C is a cross-sectional view showing the relative dimensions, other than the heights, of the wavelength conversion member and the second light reflecting member.

FIG. 6C shows an example where the upper surface 41a of the wavelength conversion member 41 is at a higher position than the upper surface 40a of the second light reflecting member 40. The upper surface 41a of the wavelength conversion member 41 in the present example is a curved surface, thus, the position of the upper surface 41a refers to the position of the highest point 41c with respect to the upper surface 20a of the first light reflecting member 20. Even in such a case, as represented by broken lines, the second light reflecting member 40 can be located on the straight line extending between a given point on the upper surface 32a of the second light emitting element 32 and a given point on the wavelength conversion member 41, and on the straight line extending between a given point on the upper surface 33a of the third light emitting element 33 and a given point on the wavelength conversion member 41. Thus, the second light reflecting member 40 can inhibit or prevent light emitted from the upper surface 32a of the second light emitting element 32 and light emitted from the upper surface 33a of the third light emitting element 33 from entering the wavelength conversion member 41.

According to this configuration, the height of the second light reflecting member 40 is lowered, and the angle at which light emitted from the second light emitting element 32 and light emitted from the third light emitting element 33 are blocked by the second light reflecting member 40 can be decreased as much as possible. The light emitted from the second light emitting element 32 and the light emitted from the third light emitting element 33 are provided to compensate wavelength ranges of insufficient intensities in the light emitted from the first light emitting elements 31 and the light emitted from the wavelength conversion member 41, thereby enabling realization of the light emitting device 101 with higher color rendering properties at broader emission angles as the angle at which the light is blocked decreases.

The second light reflecting member 40 is preferably formed with a material that can be molded in the form of a liquid or paste on the first light reflecting member 20 and then cured as it is. In order that the second light reflecting member 40 can have a sufficient height as a dam in formation of the wavelength conversion member 41, the material of the second light reflecting member 40 is preferably in the form of a paste, in other words, a liquid material having high viscosity (e.g., the viscosity of 380 to 450 Pa·s at 25° C.). Examples of such a material include thermosetting resins and thermoplastic resins. Specifically, phenolic resins, epoxy resins, BT resins, PPA, and silicone resins can be used. The second light reflecting member 40 is preferably white in color in such a manner as to have high reflectance. To achieve higher reflectance, such a base resin materials can contain powder of a light-reflecting substance dispersed therein in advance. The light reflective substance is less likely to absorb light emitted from the light emitting elements and whose refractive index is greatly different from that of the base resin material. The above-described material can be used for the light-reflecting substance.

Cover Member 50

The cover member 50 protects the first light emitting elements 31, the wavelength conversion member 41, the second light reflecting member 40 and the second light emitting element 32 from external environments. The cover member 50 is provided over the entirety of the upper surface 20a of the first light reflecting member 20. Specifically, the cover member 50 is in contact with the wavelength conversion member 41 overlying the first light emitting elements 31, the second light reflecting member 40, the second light emitting element 32, and the third light emitting element 33, while covering thereof. It can be said that the cover member 50 also covers the first light emitting elements 31 because the cover member 50 resides above the first light emitting elements 31 although the cover member 50 is not in direct contact with the first light emitting elements 31.

The cover member 50 includes a lens portion 51 having a curved surface 51c, and a flange 52 surrounding the lens portion. The lens portion 51 is located above the first light emitting elements 31, the second light emitting element 32 and the third light emitting element 33. The shape of the curved surface 51c can be designed according to the light distribution characteristics required of the light emitting device 101.

The upper surface 40a of the second light reflecting member 40 is preferably at a position lower than the upper surface 52a of the flange 52. By positioning the upper surface 40a of the second light reflecting member 40 to be at a lower position, the color mixture of light from the first light emitting elements 31, light from the second light emitting element 32 and light from the third light emitting element 33 improves. More preferably, the thickness (i.e., vertical direction) of the second light reflecting member 40 is, for example, not more than 400 µm and not less than 100 µm. With the second light reflecting member 40 having the thickness of not more than 400 µm, the color mixture improves. By virtue of the second light reflecting member 40 having the thickness of greater than 100 µm, it is easy to dam up the wavelength conversion member 41.

The cover member 50 is formed using a thermosetting resin, such as silicone resins, modified silicone resins, epoxy resins, phenolic resins, etc., or a thermoplastic resin, such as polycarbonate resins, acrylic resins, methylpentene resins, polynorbornene resins, etc. Particularly, silicone resins is preferably used due to good resistance to light and heat.

Manufacturing Method

An example of a method of manufacturing the light emitting device 101 is described with reference to FIG. 7A to FIG. 7E.

Figure 7A:
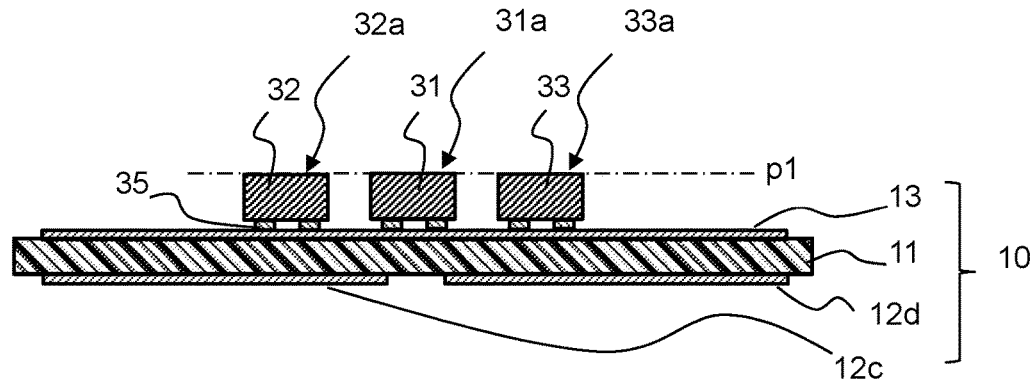
FIG. 7A is a cross-sectional view illustrating a step of the manufacturing method of the light emitting device shown in FIG. 1.
Figure 7B:
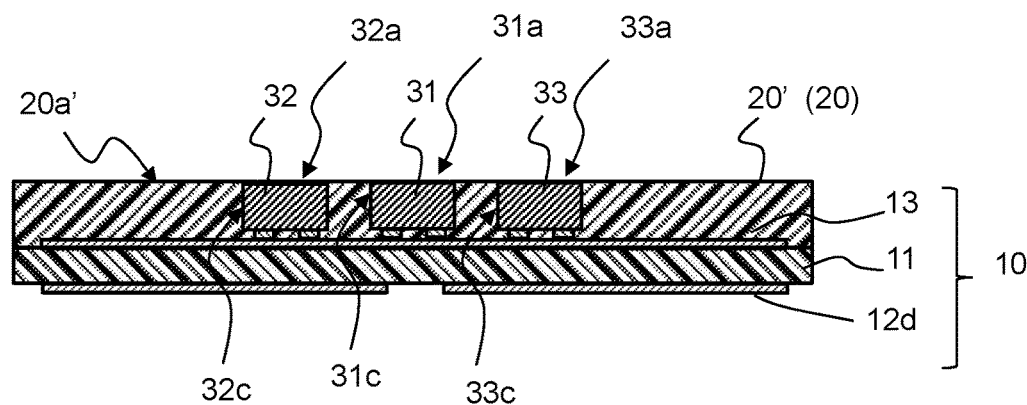
FIG. 7B is a cross-sectional view illustrating a step of the manufacturing method of the light emitting device shown in FIG. 1.

As shown in FIG. 7A, a wiring board 10 is provided. The wiring conductor 13 of the wiring board 10 is connected with the terminals of the first light emitting elements 31, the second light emitting element 32 and the third light emitting element 33 using metal bumps 35, so that the respective light emitting elements are mounted on the wiring board 10. Instead or the metal bumps, a solder, electrically-conductive paste, or the like, may be used. In this step, the height of the metal bumps may be adjusted such that the upper surfaces 31a, 32a, 33a of the first light emitting elements 31, the second light emitting element 32 and the third light emitting element 33 are substantially coplanar (p1).

In this case, an underfill that has light reflectivity and whose thermal expansion coefficient is smaller than that of the first light reflecting member 20 may be injected between the respective light emitting elements and the wiring conductor 13. By forming the underfill, the first light reflecting member 20 is less likely to be injected between the wiring conductor 13 or the base 11 and the respective light emitting elements. When the first light reflecting member 20 is injected between the respective light emitting elements and the wiring conductor 13, the first light reflecting member 20 lying below the respective light emitting elements expands during the operation of the light emitting device 101, so that the respective light emitting elements can be prevented from rising from the wiring board 10.

As shown in 7B, the resin material 20' of the first light reflecting member 20 is disposed such that the upper surfaces 31a, 32a, 33a of the first light emitting elements 31, the second light emitting element 32 and the third light emitting element 33 are exposed while the lateral surfaces 31c, 32c, 33c of the first light emitting elements 31, the second light emitting element 32 and the third light emitting element 33 are covered with the resin material 20'. The upper surface 20a' of the resin material 20' is preferably coincident with the upper surfaces 31a, 32a, 33a of the first light emitting elements 31, the second light emitting element 32 and the third light emitting element 33. Thereafter, the resin material 20' is cured, whereby the first light reflecting member 20 is formed.

Figure 7C:
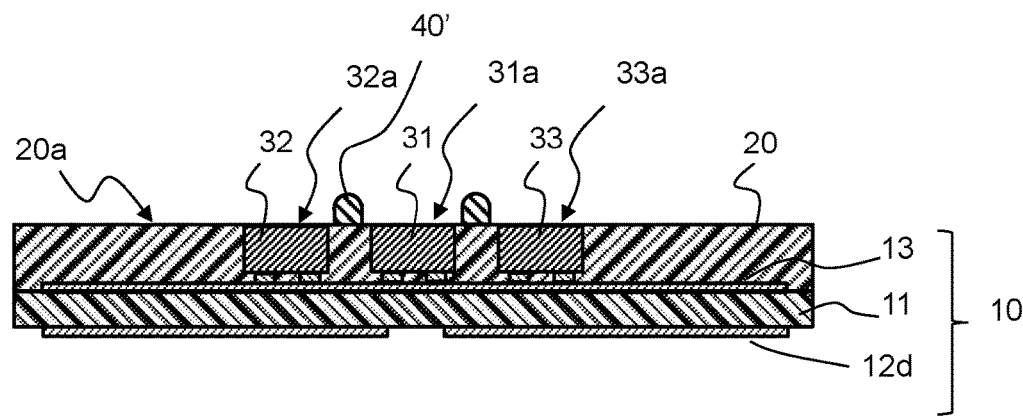
FIG. 7C is a cross-sectional view illustrating a step of the manufacturing method of the light emitting device shown in FIG. 1.

As shown in FIG. 7C, the resin material 40' of the second light reflecting member 40 is formed on the upper surface 20a of the first light reflecting member 20 interposed between the first light emitting elements 31 and the second light emitting element 32 or the third light emitting element 33 in such a manner as to surround the upper surfaces 31a of the first light emitting elements 31 in a plan view. The resin material 40' may be formed on the upper surface 20a using a resin discharging device. The resin material 40' may be molded using a die or the like to be placed on the upper surface 20a. Alternatively, the resin material 40' may be formed using an inkjet or 3D printer or the like. The resin material 40' is cured, whereby the second light reflecting member 40 is formed.

Figure 7D:
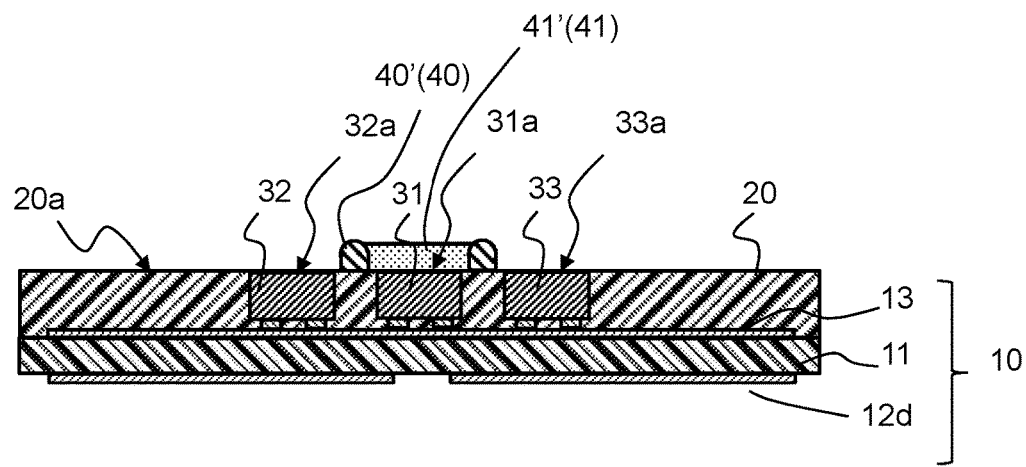
FIG. 7D is a cross-sectional view illustrating a step of the manufacturing method of the light emitting device shown in FIG. 1.

As shown in FIG. 7D, the resin material 41' of the wavelength conversion member 41 is placed in a region surrounded by the second light reflecting member 40. Thereafter, the resin material 41' is cured, whereby the wavelength conversion member 41 is formed.

Figure 7E:
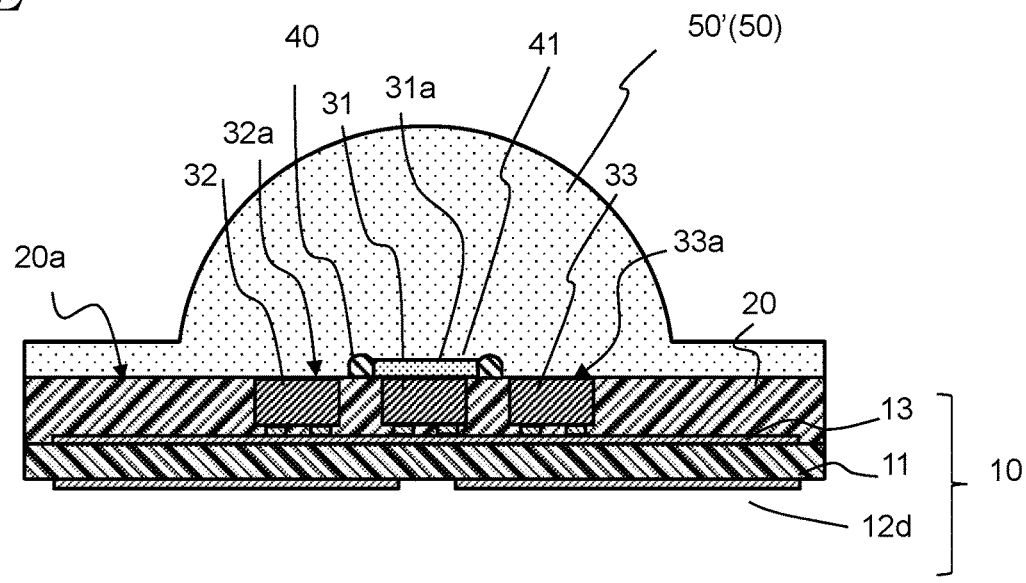
FIG. 7E is a cross-sectional view illustrating a step of the manufacturing method of the light emitting device shown in FIG. 1.

As shown in FIG. 7E, on the upper surface 20a of the first light reflecting member 20, the resin material 50' of the cover member 50 is placed so as to cover the second light reflecting member 40, the wavelength conversion member 41, and the upper surfaces 32a, 33a of the second light emitting element 32 and the third light emitting element 33 and then molded, whereby the cover member 50 is formed. Disposition of the cover member 50 can be realized by various methods, such as transfer molding, compression molding, application of a resin (potting), and molding with the use of a casting case. Thereby, the light emitting device 101 is completed. When the wiring boards 10 of a plurality of light emitting devices 101 are connected together, and the first light reflecting member 20 and the cover member 50 are continuously formed among the plurality of light emitting devices 101, the plurality of light emitting devices 101 which are connected by the first light reflecting member 20 and the cover member 50 are cut after formation of the cover member 50 such that the light emitting devices 101 in the form of separated pieces are obtained.

Light Emission of Light Emitting Device 101

In the light emitting device 101, when the light of the first peak wavelength and the light of the third peak wavelength are respectively blue light and yellow light, part of the blue light emitted from the first light emitting elements 31 is absorbed by the wavelength conversion member 41, and yellow light is emitted from the wavelength conversion member 41. Therefore, due to blue light that has passed through as it is without being absorbed by the wavelength conversion member 41 and yellow light produced in the wavelength conversion member 41, the light emitting device 101 emits white light. The second peak wavelength of light emitted from the second light emitting element 32 is different from the first peak wavelength and the third peak wavelength, thus, the second peak wavelength compensates for the light intensity of a wavelength range in which the intensity is insufficient in light emitted as white light. Thus, light emitted from the second light emitting element 32 can compensate for the wavelength range in which the intensity is insufficient in the white light emitted from the light emitting device 101, so that the light emitting device 101 as a whole can emit white light with high color rendering properties. The third peak wavelength is preferably longer than the first peak wavelength. By converting the third peak wavelength to a wavelength longer than the first peak wavelength, the light extraction efficiency is improved as compared with a case where the third peak wavelength is shorter than the first peak wavelength. The third peak wavelength is preferably shorter than the second peak wavelength. In this case, the difference between the first peak wavelength and the third peak wavelength is small, therefore, the options for the phosphor which can be used in the wavelength conversion member can be increased.

The lateral surfaces of the first light emitting elements 31 are covered with the first light reflecting member 20, thus light emitted from the lateral surfaces of the second light emitting element 32 is inhibited or prevented from entering the first light emitting elements 31 from their lateral surfaces, so that light absorption between the light emitting elements is less likely to occur. This can improve the light extraction efficiency of the light emitting device 101.

The second light reflecting member 40 is located between the second light emitting element 32 and the wavelength conversion member 41 in a plan view; thus, the second light reflecting member 40 can inhibit or prevent light emitted from the second light emitting element 32 from entering the wavelength conversion member 41. Particularly, the height of the second light reflecting member 40 is higher than the upper surface 41a of the wavelength conversion member 41, the light emitted from the upper surface 32a of the second light emitting element 32 can be more securely inhibited or prevented from entering the wavelength conversion member 41. As a result, the light from the second light emitting element 32 can be inhibited or prevented from being absorbed by the wavelength conversion member 41, so that the luminance of the light emitting device can be increased. Accordingly, the present disclosure can realize the light emitting device 101 with high luminance and high color rendering properties.

Other Embodiments

Figure 8:
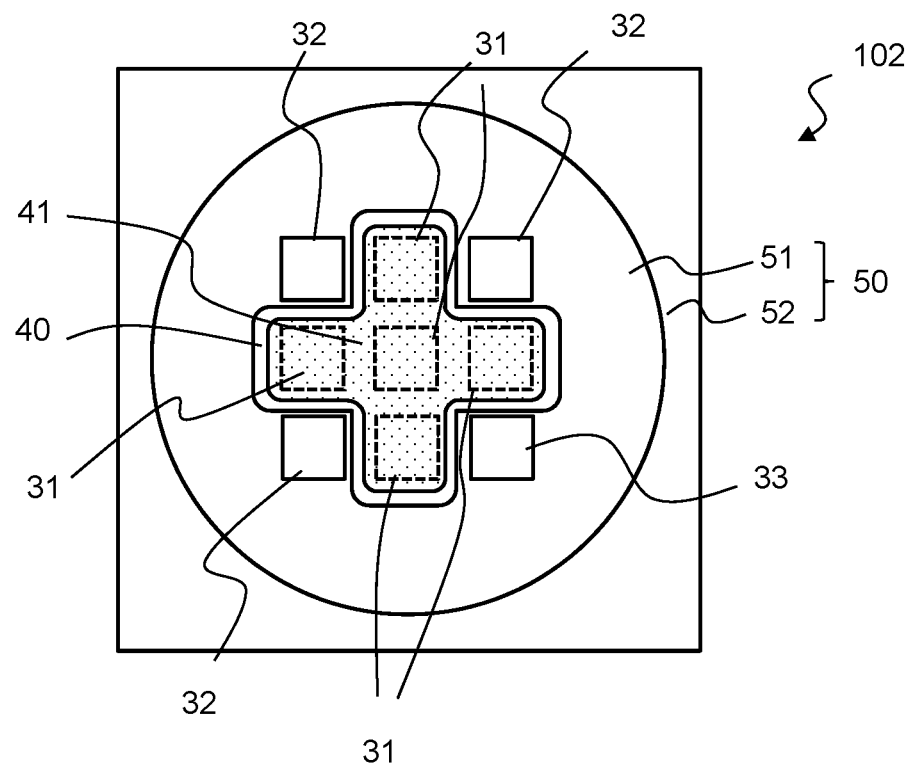
FIG. 8 is a plan view showing another embodiment of the light emitting device of the present disclosure.

The above-described embodiment is an example of the light emitting device 101 of the present disclosure. The light emitting device of the present disclosure may be variously modified in the above-described embodiment. Particularly, the type, number, and peak wavelength of the light emitting elements can be variously modified. For example, FIG. 8 is a plan view showing another example of the light emitting device of the present disclosure. The light emitting device 102 shown in FIG. 8 includes five first light emitting elements 31, three second light emitting elements 32, and one third light emitting element 33. The first light emitting elements 31 emit blue light as in the above-described embodiment. The wavelength conversion member 41 absorbs the blue light and emits yellow light. The second light emitting elements 32 and the third light emitting element 33 respectively emit green light and red light.

The number of the first light emitting elements 31 is not limited to the exemplary number in the above-described embodiment, but is preferably greater than the number of the second light emitting elements 32 and than the number of the third light emitting elements 33. The first light emitting element is preferably located between the second light emitting element 32 and the third light emitting element 33. In such an arrangement, the areas from which the light of the first peak wavelength and the light of the third peak wavelength output are positioned between the second light emitting element 32 and the third light emitting element 33. This can improve the color mixture as compared with a case where the second light emitting element 32 and the third light emitting element 33 adjacently located.

The relationship between the color of emitted light and the wavelength range is shown in Table 1. The first peak wavelength and the third peak wavelength may respectively have values within the wavelength ranges corresponding to blue and yellow shown in Table 1 below. The second peak wavelength and the fourth peak wavelength may respectively have values within the wavelength ranges corresponding to red and green shown in Table 1 below.

TABLE 1

| color of emitted light | wavelength range (nm) |
|---|---|
| red | 590-770 |
| yellow | 550-590 |
| green | 490-550 |
| blue | 430-490 |

The third peak wavelength may alternatively have a value in the wavelength range of red or green. In this case, the second peak wavelength has a value in the wavelength range of green or red. The light emitting device 101 may not include the third light emitting element 33. Although, in order to compensate for red or green light emitted from phosphor, the third light emitting element 33 has the fourth peak wavelength, which is different from the third peak wavelength, the fourth peak wavelength may alternatively have a value in the same red or green wavelength range.

The wavelength conversion member 41 may further convert the light of the first peak wavelength into light of the third peak wavelength and to light of the fifth peak wavelength. In this case, for example, the first peak wavelength may have a value in the wavelength range corresponding to blue, and the third peak wavelength and the fifth peak wavelength may respectively have values in the wavelength ranges corresponding to red and green. That is, the wavelength conversion member 41 may include a red phosphor and a green phosphor as the phosphor 42. In this case, among the light emitted from the first light emitting elements 31, light which has not been absorbed by the phosphor 42 (i.e., blue light) and red light and green light emitted from the red phosphor and the green phosphor achieve white light. In this case, the second light emitting element 32 and the third light emitting element 33 respectively have peak wavelengths, which are different from the third peak wavelength and the fifth peak wavelength, in order to compensate for low luminance portions of the light of the third peak wavelength and the light of the fifth peak wavelength emitted from the red phosphor and the green phosphor, although the second light emitting element 32 and the third light emitting element 33 may emit light of the second peak wavelength and light of the fourth peak wavelength in the same red and green wavelength ranges.

Alternatively, the third peak wavelength may have a value in the wavelength range of yellow, and the fifth peak wavelength may have a value in the wavelength range of red or green. In this case, the second light emitting element 32 and the third light emitting element 33 may emit light whose peak wavelength is in a wavelength range of a color of low luminance.

The light emitting device of the present disclosure may further include a protection element such as a Zener diode. In this case, for example, the protection element may be electrically connected with the wiring conductor and embedded in the first light reflecting member.

A lighting device according to embodiments of the present disclosure is applicable to various uses, including indoor lighting, outdoor lighting, various indicators, displays, backlights for liquid crystal display devices, sensors, traffic lights, on-board components, channel letters for signboards, etc.

While the present invention has been described with respect to exemplary embodiments thereof, it will be apparent to those skilled in the art that the disclosed invention may be modified in numerous ways and may assume many embodiments other than those specifically described above. Accordingly, it is intended that the appended claims cover all modifications of the invention that fall within the true spirit and scope of the invention.

What is claimed is:

1. A light emitting device, comprising:
   at least one first light emitting element configured to emit light of a first peak wavelength;
   at least one second light emitting element configured to emit light of a second peak wavelength that is different from the first peak wavelength;
   a first light reflecting member disposed in contact with at least one lateral surface of the first light emitting element and at least one lateral surface of the second light emitting element, the first light reflecting member having an upper surface from which an upper surface of the at least one first light emitting element and an upper surface of the at least one second light emitting element are exposed,
   a wavelength conversion member covering the upper surface of the at least one first light emitting element, the wavelength conversion member being configured to convert light of the first peak wavelength into light of a third peak wavelength that is different from the first peak wavelength and the second peak wavelength; and
   a second light reflecting member surrounding the at least one first light emitting element in a plan view and being in contact with the wavelength conversion member, at least a portion of the second light reflecting member being at a position higher than the first light reflecting member.

2. The light emitting device according to claim 1, wherein:
   the first peak wavelength is shorter than the second peak wavelength.

3. The light emitting device according to claim 2, wherein:
   the third peak wavelength is longer than the first peak wavelength.

4. The light emitting device according to claim 2, wherein:
the first peak wavelength is blue, and
the second peak wavelength is green.

5. The light emitting device according to claim 1, wherein:
the upper surface of the at least one first light emitting element and the upper surface of the at least one second light emitting element are substantially coplanar in a cross sectional view.

6. The light emitting device according to claim 1, further comprising:
a cover member covering the first light reflecting member, the at least one second light emitting element, and the wavelength conversion member.

7. The light emitting device according to claim 1 wherein:
in a plan view, an area in which the wavelength conversion member overlaps the at least one first light emitting element is not less than 70% of an area of the wavelength conversion member.

8. The light emitting device according to claim 1, further comprising:
a wiring board on which the at least one first light emitting element and the at least one second light emitting element are mounted.

9. The light emitting device according to claim 1, wherein:
the upper surface of the second light reflecting member is at a position higher than an upper surface of the wavelength conversion member.

10. The light emitting device according to claim 1, wherein:
the wavelength conversion member includes a fluoride complex phosphor activated with manganese.

11. The light emitting device according to claim 1, wherein:
the wavelength conversion member includes a light diffuser.

12. The light emitting device according to claim 1, wherein:
the light diffuser includes an oxide.

13. The light emitting device according to claim 1, wherein:
the upper surface of the at least one first light emitting element and the upper surface of the at least one second light emitting element are substantially coplanar in a cross sectional view.

14. The light emitting device according to claim 4, further comprising:
a cover member covering the first light reflecting member, the at least one second light emitting element, and the wavelength conversion member.

15. The light emitting device according to claim 4 wherein:
in a plan view, an area in which the wavelength conversion member overlaps the at least one first light emitting element is not less than 70% of an area of the wavelength conversion member.

16. The light emitting device according to claim 4, further comprising:
a wiring board on which the at least one first light emitting element and the at least one second light emitting element are mounted.

17. The light emitting device according to claim 4, wherein:
the upper surface of the second light reflecting member is at a position higher than an upper surface of the wavelength conversion member.

18. The light emitting device according to claim 4, wherein:
the wavelength conversion member includes a fluoride complex phosphor activated with manganese.

19. The light emitting device according to claim 4, wherein:
the wavelength conversion member includes a light diffuser.

20. The light emitting device according to claim 4, wherein:
the light diffuser includes an oxide.

* * * * *